United States Patent
Nagatomo et al.

(10) Patent No.: US 7,492,231 B2
(45) Date of Patent: Feb. 17, 2009

(54) OSCILLATOR STARTING CONTROL CIRCUIT

(75) Inventors: Kei Nagatomo, Yokohama (JP); Keigo Shingu, Tokyo (JP); Hisato Takeuchi, Yokohama (JP)

(73) Assignee: Panasonic Corporation, Osaka (JP)

( * ) Notice: Subject to any disclaimer, the term of this patent is extended or adjusted under 35 U.S.C. 154(b) by 477 days.

(21) Appl. No.: 11/238,145

(22) Filed: Sep. 29, 2005

(65) Prior Publication Data

US 2006/0071730 A1    Apr. 6, 2006

(30) Foreign Application Priority Data

Oct. 1, 2004  (JP) .............................. 2004-289775
Sep. 22, 2005  (JP) .............................. 2005-275362

(51) Int. Cl.
*H03B 5/32*  (2006.01)

(52) U.S. Cl. ................. 331/158; 331/116 R; 331/177 V

(58) Field of Classification Search ............. 331/116 R, 331/116 FE, 154, 158, 160, 177 V
See application file for complete search history.

(56) References Cited

U.S. PATENT DOCUMENTS 6,040,744 A * 3/2000 Sakurai et al. .............. 331/176
6,172,576 B1 * 1/2001 Endo et al. ............. 331/116 R
6,710,669 B2 * 3/2004 Hasegawa et al. ........ 331/177 V
7,009,460 B2 * 3/2006 Wilcox ........................ 331/173

FOREIGN PATENT DOCUMENTS

| JP | 9-326638 | 12/1997 |
|----|----------|---------|
| JP | 11-088052 | 3/1999 |
| JP | 2001-24435 A | 1/2001 |
| JP | 2002-237722 | 8/2002 |

OTHER PUBLICATIONS

Japanese Office Action, with English Translation, issued in corresponding Japanese Patent Application No. 2005-275362, dated on Dec. 5, 2007.

* cited by examiner

*Primary Examiner*—Robert Pascal
*Assistant Examiner*—Ryan J. Johnson
(74) *Attorney, Agent, or Firm*—McDermott Will & Emery LLP

(57) ABSTRACT

An oscillator starting control circuit capable of shortening a starting time and stably controlling the starting time, and furthermore, stabilizing an oscillating frequency after starting an oscillating circuit. An oscillating circuit (1) is a crystal oscillating circuit in which an input and an output of an inverter (14) are connected to both ends of a crystal oscillator (15) and both ends of a resistor (16), the input is connected to a drain of an MOS variable capacity (10), the output is connected to a drain of an MOS variable capacity (11), a source of the MOS variable capacity (10) is connected to a fixed capacity (12), a source of the MOS variable capacity (11) is connected to a fixed capacity (13), and the other ends of the fixed capacities (12, 13) are connected to a GND.

8 Claims, 15 Drawing Sheets

OSCILLATOR STARTING CONTROL CIRCUIT

BACKGROUND OF THE INVENTION

1. Field of the Invention

The present invention relates to an oscillator starting control circuit which is suitable for shortening and controlling a starting time of a crystal oscillator circuit and stabilizing an oscillating frequency.

2. Description of the Related Art

In recent years, a crystal oscillating circuit has often been used as a frequency to be a reference in electronic equipment, and furthermore, a transmission data rate has also been increased. In such electronic equipment, an intermittent operation is carried out in order to reduce power consumption. For this reason, there has been desired an oscillating circuit for carrying out starting in a short time for the crystal oscillating circuit used as a frequency to be their reference and outputting a constant oscillating frequency by a low consumed power. Therefore, the crystal oscillating circuit is very useful for a circuit technique.

Moreover, a frequency output from the crystal oscillating circuit is used as a frequency to be a reference in the electronic equipment Therefore, it is necessary to provide an oscillating circuit for carrying out starting in a short time and outputting a constant oscillating frequency after the starting.

Conventionally, the crystal oscillating circuit of this type is constituted as shown in an example of a circuit diagram of FIG. 2 In FIG. 2, 1 denotes an oscillating circuit, 2 denotes an REG voltage circuit, 3 denotes a voltage control circuit, 10 and 11 denote an MOS variable capacity, 12 and 13 denote a fixed capacity, 14 denotes an inverter, 15 denotes a crystal oscillator, 16, 18 and 19 denote a resistor, and 17 denotes a source voltage. The crystal oscillating circuit shown in FIG. 2 has such a structure as to supply a power of the oscillating circuit portion 1 by the REG voltage source 2 and to form an oscillating loop by the crystal oscillator 15, the oscillating circuit portion 1, the MOS capacities 10 and 11, and the fixed capacities 12 and 13, and to output an oscillating waveform.

Referring to the crystal oscillating circuit constituted as described above, an operation thereof will be described. When a source voltage is applied from the source voltage (17), a certain source voltage is supplied from the REG voltage circuit portion (2) to the oscillating circuit portion (1) and the crystal oscillator (15) and an electric potential is applied to the oscillating circuit portion (1) so that an impulse is given to the crystal oscillator (15) Consequently, an oscillating operation is started to be carried out. Then, an oscillating amplitude oscillated in the oscillating circuit portion (1) is output. Moreover, a control voltage is applied from the voltage control circuit (3) to a gate of the MOS variable capacity (10, 11) through the resistor (18, 19) and an MOS capacity value is changed. Consequently, a load capacity CL of the oscillating circuit can be varied to carry out a regulation into a desirable oscillating frequency f0.

An oscillating amplitude and a starting time of the crystal oscillating circuit are determined by a magnitude of a current to be excited to the crystal oscillator (15) when the power supply for the crystal oscillating circuit is turned ON, a negative resistance and a magnitude of the load capacity CL of the crystal oscillating circuit In particular, it is apparent that a starting time is shorter when the load capacity CL is smaller.

When the load capacity CL is reduced, therefore, the starting time is shortened. However, the oscillating frequency f0 is also decreased In the conventional circuit, therefore, the load capacity CL is to be determined from the desirable oscillating frequency f0.

In an oscillating circuit using a variable capacity of a varicap diode, moreover, there has been known a circuit for temporarily changing the load capacity CL and carrying out the starting earlier as in the following JP-A-2001-24435 Publication. With this structure, a voltage to be applied to the varicap diode is limited. For this reason, the load capacity CL cannot be reduced sufficiently so that a sufficient advantage for shortening the starting time cannot be obtained. Moreover, it is impossible to carry out an application to an oscillating circuit using an MOS variable capacity having a high sensitivity. Furthermore, there is a drawback that the starting time is easily varied depending on the starting conditions of a power to be applied to the oscillating circuit.

In the case in which the conventional crystal oscillating circuit shown in FIG. 2 is used or the case in which the crystal oscillating circuit described in the Patent Document 1 is used, thus, an oscillating output in the starting to which a source voltage is applied depends on the load capacity CL which is the cause of a starting time delay. For this reason, there is caused a phenomenon in which a rise time is reduced. When the source voltage rises, moreover, an oscillation is started. Consequently, the starting time of the oscillator also fluctuates depending on the starting time of the source voltage and is not stabilized.

On the other hand, in portable equipment represented by a cell phone, an intermittent operation is usually carried out in order to reduce a consumed power. In order to prolong the lifetime of a battery, it is more advantageous that a duration or the OFF state of the oscillator is longer. For this reason, there is required an oscillator capable of shortening the starting time and stably controlling the starting time.

Moreover, the frequency of the output waveform of the oscillating circuit depends on the capacity value of a variable capacitance unit which is a load capacity of an oscillator. In the case in which a variable capacitance unit having a floating node is used, therefore, the capacity value of the variable capacitance unit is changed with a variation in the voltage of the floating node. After starting the oscillating circuit, therefore, it is impossible to output a certain oscillating frequency.

SUMMARY OF THE INVENTION

The invention has been made in consideration of the conventional circumstances and has an object to provide an oscillator starting control circuit capable of shortening a starting time and stably controlling the starting time.

Moreover, it is an object of the invention to provide an oscillator starting control circuit capable of stabilizing an oscillating frequency after starting an oscillating circuit.

The invention provides an oscillator starting control circuit for changing a capacity value of an MOS variable capacity to carry out a regulation into a predetermined oscillating frequency in an oscillator for forming an oscillating loop by a crystal oscillator and the MOS variable capacity, comprising a first switch for reducing the capacity value of the MOS variable capacity for a predetermined period after starting.

According to the structure, the capacity value of the MOS variable capacity is reduced for a predetermined period after the starting. Consequently, a starting time of the oscillator is shortened. By returning the capacity value of the MOS variable capacity to be a normal value after passing through the predetermined period, it is possible to stably oscillate the oscillator.

In the oscillator starting control circuit according to the invention, moreover, there is further provided a first time constant circuit for setting an operating period of the first switch in response to a rise in a source voltage which is supplied.

According to the structure, it is possible to stabilize a period for which the capacity value of the MOS variable capacity is reduced. Therefore, it is possible to stably control a starting time.

In the oscillator starting control circuit according to the invention, furthermore, the first switch is connected to a gate of the MOS variable capacity and a reference potential.

According to the structure, it is possible to reduce the load capacity of the oscillator, thereby shortening the starting time.

In the oscillator starting control circuit according to the invention, moreover, there is further provided a second switch for cutting off an oscillator output for a predetermined period after starting.

According to the structure, it is possible to prevent a delay of the starting time or a non-oscillation which is caused by an output waveform in the starting which goes around the oscillator.

In the oscillator starting control circuit according to the invention, furthermore, there is further provided a second time constant circuit for setting a cut-off period of a second switch in response to a rise in a source voltage which is supplied.

According to the structure, it is possible to accurately set a period for which an oscillator output is cut off.

In the oscillator starting control circuit according to the invention, moreover, there are further provided a first capacity for connecting a gate of the MOS variable capacity to one of ends of the crystal oscillator, and a second capacity for connecting a drain of the MOS variable capacity to the other end of the crystal oscillator, a control voltage being applied to the gate and the drain of the MOS variable capacity to change the capacity value of the MOS variable capacity, thereby carrying out a regulation into a predetermined oscillating frequency.

According to the structure, an oscillating loop is constituted by the single MOS variable capacity. Therefore, it is possible to reduce the size of the oscillator starting control circuit.

In the oscillator starting control circuit according to the invention, furthermore, there is further a voltage detecting circuit for detecting a rise in a source voltage which is supplied and supplying a driving signal to the first or second time constant circuit.

According to the structure, it is possible to accurately detect the rise in the source voltage and to stably control the starting time.

In the oscillator starting control circuit according to the invention, moreover, the MOS variable capacity has a floating node, the oscillator starting control circuit further comprising a third switch for carrying out a short circuit for a predetermined period after starting, thereby fixing the floating node to have a predetermined voltage.

According to the structure, the short circuit is carried out for the predetermined period after the starting, thereby fixing the floating node to have the predetermined voltage. Consequently, it is possible to enhance the stability of the floating node of the MOS variable capacity when starting an oscillation and to output a certain oscillating frequency after starting the oscillating circuit.

In the oscillator starting control circuit according to the invention, furthermore, a short-circuit period of the third switch is set by the first time constant circuit.

According to the structure, it is possible to accurately set a stabilized starting period.

According to the oscillator starting control circuit in accordance with the invention, a starting time can be shortened remarkably, and furthermore, the starting time can be stabilized. Moreover, it is possible to stabilize an oscillating frequency after starting an oscillating circuit.

By using the oscillator starting control circuit according to the invention in portable equipment represented by a cell phone, furthermore, it is possible to shorten a starting time during an intermittent operation, thereby prolonging a time required for an OFF state. Consequently, it is possible to enhance the effect of reducing a consumed power.

DESCRIPTION OF THE PREFERRED EMBODIMENTS

A specific example of an oscillator starting control circuit according to an embodiment of the invention will be described below with reference to the drawings.

First Embodiment

Figure 1:
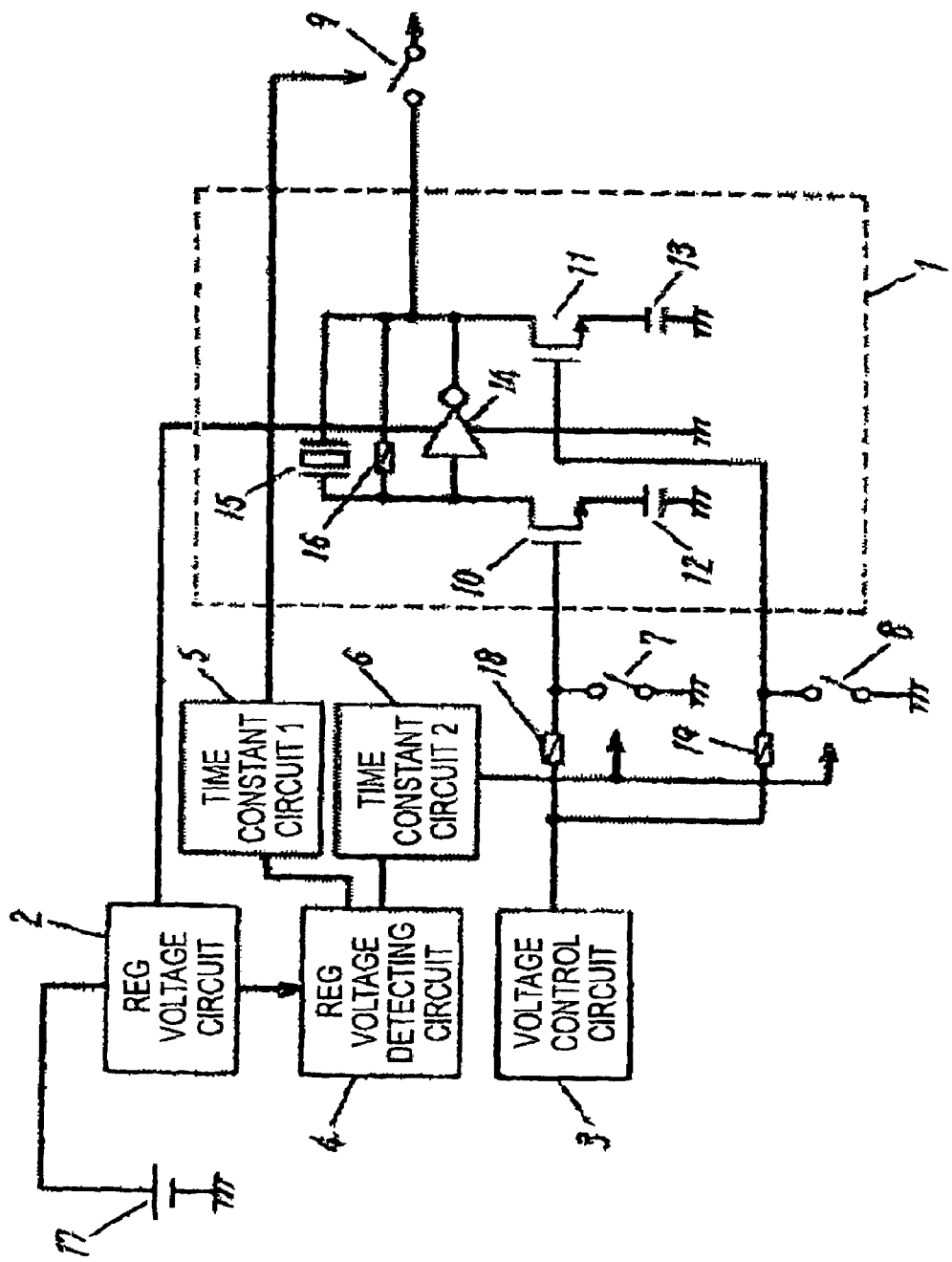
FIG. 1 is a circuit diagram showing an example of a structure of an oscillator starting control circuit according to a first embodiment of the invention.
Figure 2:
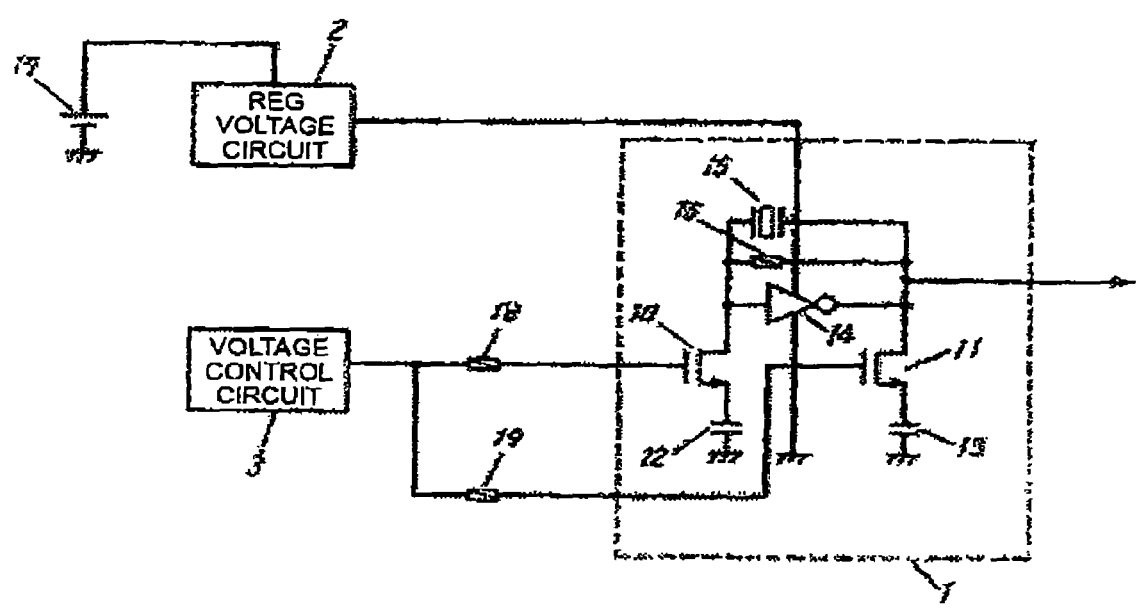
FIG. 2 is a diagram showing an example of a structure of a conventional oscillating circuit.

FIG. 1 is a diagram showing a first embodiment of an oscillator starting control circuit according to the invention.

In FIG. 1, an REG voltage is applied to an oscillating circuit (1: oscillator) by an REG voltage circuit (2) to which a source voltage (17) is applied. The oscillating circuit (1) in FIG. 1 is a crystal oscillating circuit in which an input and an output of an inverter (14) is connected to both ends of a crystal oscillator (15) and both ends of a resistor (16), and the input is connected to a drain of an MOS variable capacity (10) and the output is connected to a drain of an MOS variable capacity (11), the MOS variable capacity (10) has a source connected to a fixed capacity (12) and the MOS variable capacity (11) has a source connected to a fixed capacity (13), and the other ends of the fixed capacities (12, 13) are connected to a GND.

Furthermore, a resistor (18) and a switch (7: a first switch) are connected to a gate of the NOS variable capacity (10) and a resistor (19) and a switch (8: a first switch) are connected to a gate of the MOS variable capacity (11), and the other ends of the resistors (18, 19) are connected to each other, and furthermore, are connected to a voltage control circuit (3).

On the other hand, an REG voltage detecting circuit (4) is connected in such a manner that a signal for detecting a rise in the REG voltage circuit (2) is transmitted thereto and is transmitted to time constant circuits 1 and 2 (6 and 5) Furthermore, the time constant circuit 1 (6) is connected to transmit a control signal for short-circuiting or opening the switches (7, 8) in response to the signal described above, and the time constant circuit 2 (5) is connected to transmit a control signal for short-circuiting or opening a switch (9)

In FIG. 1, there will be considered the oscillating circuit (1) to be operated by an application of an REG voltage through the REG voltage circuit (2) to which the source voltage (17) is applied The REG voltage detecting circuit (4) serves to detect that the REG voltage circuit 2 rises when the source voltage (17) is started, and the time constant circuit 1 (6) and the time constant circuit 2 (5) are operated by setting a rise time as a reference. The time constant circuit 1 (6) short-circuits the switches (7, 8) for a certain time from the reference time and opens them when the certain time passes. Consequently, a capacity value seen from the drain side of an MOS transistor can be reduced remarkably for the certain period and a load capacity CL of the crystal oscillating circuit (1) can be maintained to be small, and an oscillation in the starting can be initiated earlier. When the oscillation is initiated to some degree, the switches (7, 8) are opened in such a manner that the capacity values of the MOS variable capacities 10 and 11 can be controlled at a control voltage applied from the voltage control circuit (3) and a stable oscillation can be carried out at a desirable frequency f0 by a regulation of the load capacity CL.

Furthermore, the time constant circuit 2 (5) is operated to open the switch (9: the second switch) for a certain time from the reference time and to short-circuit the same switch when the certain time passes. Consequently, it is possible to prevent a delay of a starting time, or a non-oscillation from being caused by an output waveform in the starting period which goes around the oscillator.

Next, an operation to be carried out in the starting period will be described by using a time chart.

Figure 3:
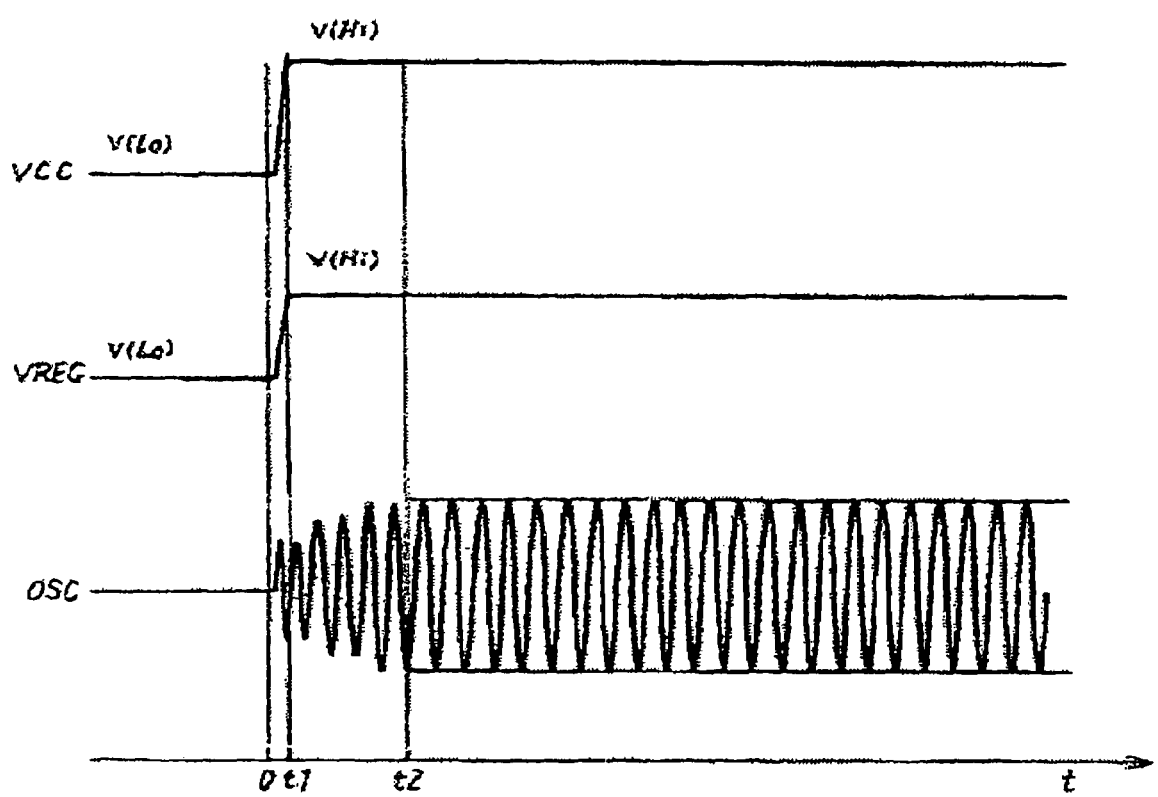
FIG. 3 is a chart showing an example (1) of a starting characteristic of the conventional oscillating circuit.

FIG. 3 shows an example of a starting characteristic of a conventional oscillating circuit. When a source voltage VCC rises, an REG voltage rises following the source voltage VCC and comes to a certain voltage V (Hi) at a time of t=t1. Referring to an oscillating waveform of the oscillator, an oscillation is initiated for a certain duration from the initiation of the rise in the REG voltage to the time of t=t1 and an amplitude is gradually increased. Then, the oscillating waveform is stabilized at a time of t=t2. A gradual increase in the amplitude of the oscillating waveform with the passage of time mainly depends on the load capacity CL of the oscillator, causing a delay of a starting time.

Figure 4:
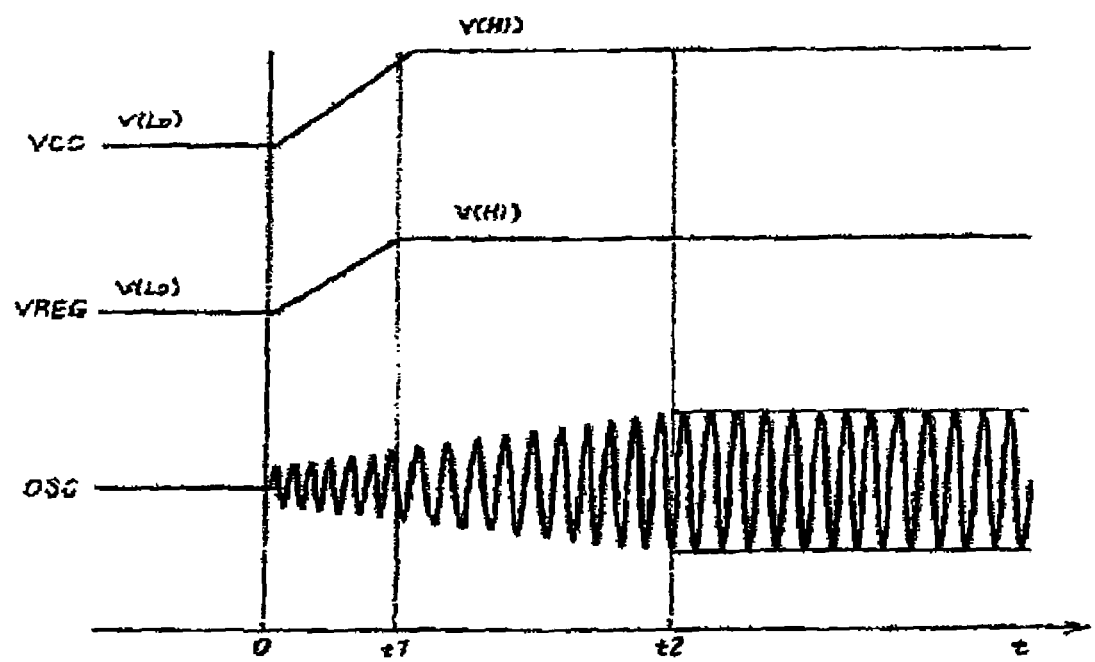
FIG. 4 is a chart showing an example (2) of the starting characteristic of the conventional oscillating circuit.

FIG. 4 shows an example of the starting characteristic of the conventional oscillating circuit, showing the case in which the source voltage VCC rises more slowly than in the case of FIG. 3. Also in this case, the REG voltage rises following the source voltage VCC and comes to a certain voltage at a time of t=t1 Referring to an oscillating waveform, an oscillation is initiated for a duration from the initiation of the rise in the REG voltage to the time of t=t1 and an amplitude is gradually increased. Then, the oscillating waveform is stabilized at a time of t=t2. The time of t2 in FIG. 4 is different from the time of t2 in FIG. 3 and (the time of t2 in FIG. 4)>(the time of t2 in FIG. 3) is generally obtained. There is a drawback that the time of t=t2 for the stabilization of the oscillating waveform fluctuates depending on the rising characteristic of the source voltage VCC and is not stabilized. As described above, the conventional circuit has a drawback that the starting time is delayed, and furthermore, is not stabilized.

Figure 5:
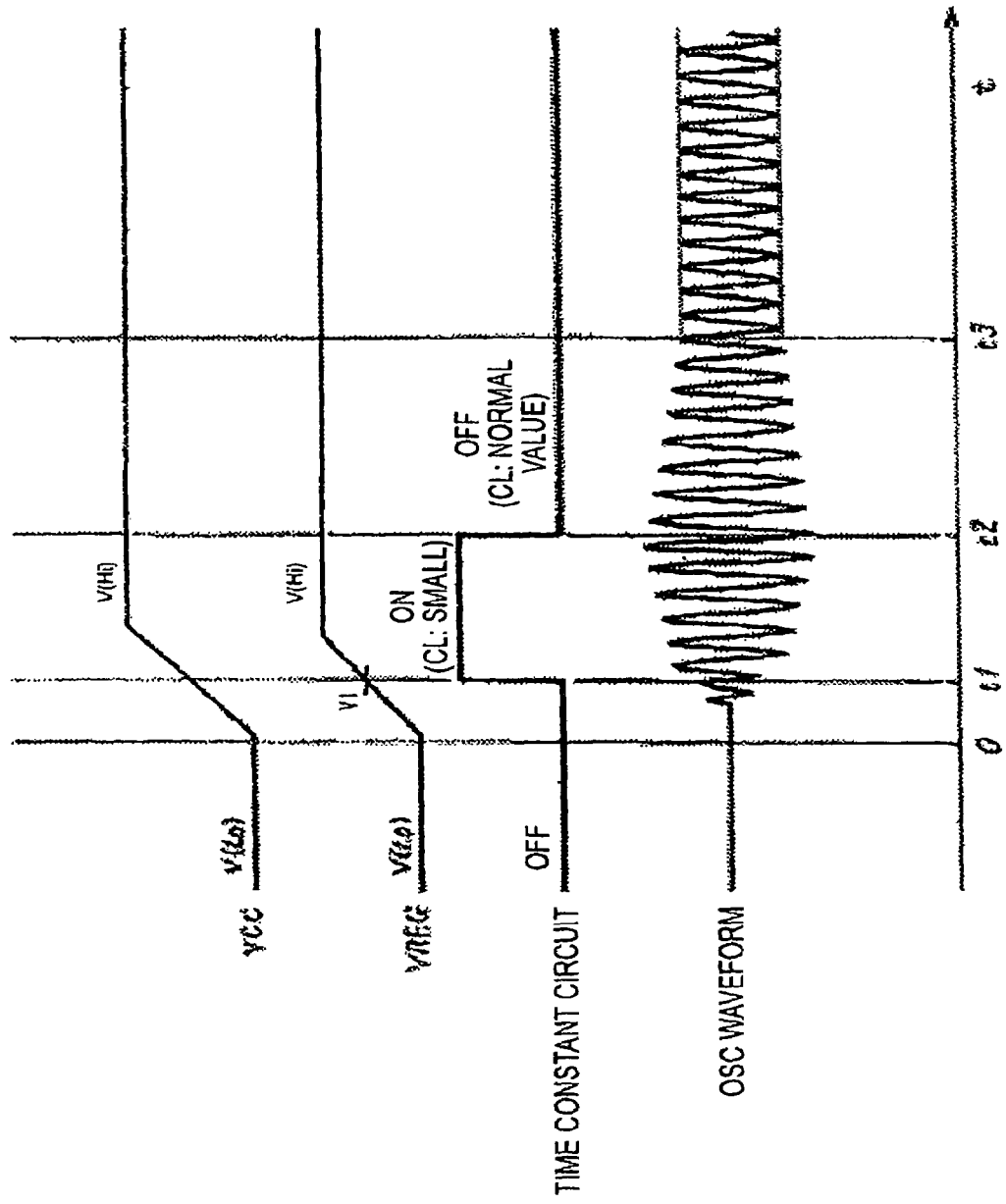
FIG. 5 is a chart showing an example of a starting characteristic of an oscillating circuit according to the first embodiment of the invention (the case in which a time constant circuit 1 (6) is directly connected to an REG voltage circuit (2) (an REG voltage detecting circuit (4) is not operated) and is operated, and a time constant circuit 2 (5) is not operated)

FIG. 5 shows an example of the starting characteristic of the oscillating circuit according to the embodiment. Referring to FIG. 5, description will be given to the case in which the time constant circuit 1 (6) is directly connected to the REG voltage circuit (2) (the REG voltage detecting circuit (4) is not operated) and is thus operated, and the time constant circuit 2 (5) is not operated.

When the source voltage VCC rises, the REG voltage rises following the source voltage VCC and comes to a certain voltage at a time of t=t1 Referring to the oscillating waveform of the oscillator, the time constant circuit 1 (6) is started to be operated for a duration from the initiation of the rise in the REG voltage to the time of t=t1 and the switches 7 and 8 for reducing the load capacity CL value are turned ON in response to a signal output from the time constant circuit 1 (6) at t1≦t≦t2 so that the load capacity CL of the oscillator is maintained to be small. The oscillator initiates an oscillation at 0≦t≦t1 and the load capacity CL is small at t1≦t≦t2. Therefore, an amplitude is increased considerably quickly. Consequently, it is possible to shorten a starting time. The switches 7 and 8 are turned OFF so that the CL value is changed into a normal value at the time of t2, and the amplitude gradually approaches a stationary state and the oscillating waveform is stabilized at a time of t=t3.

Figure 6:
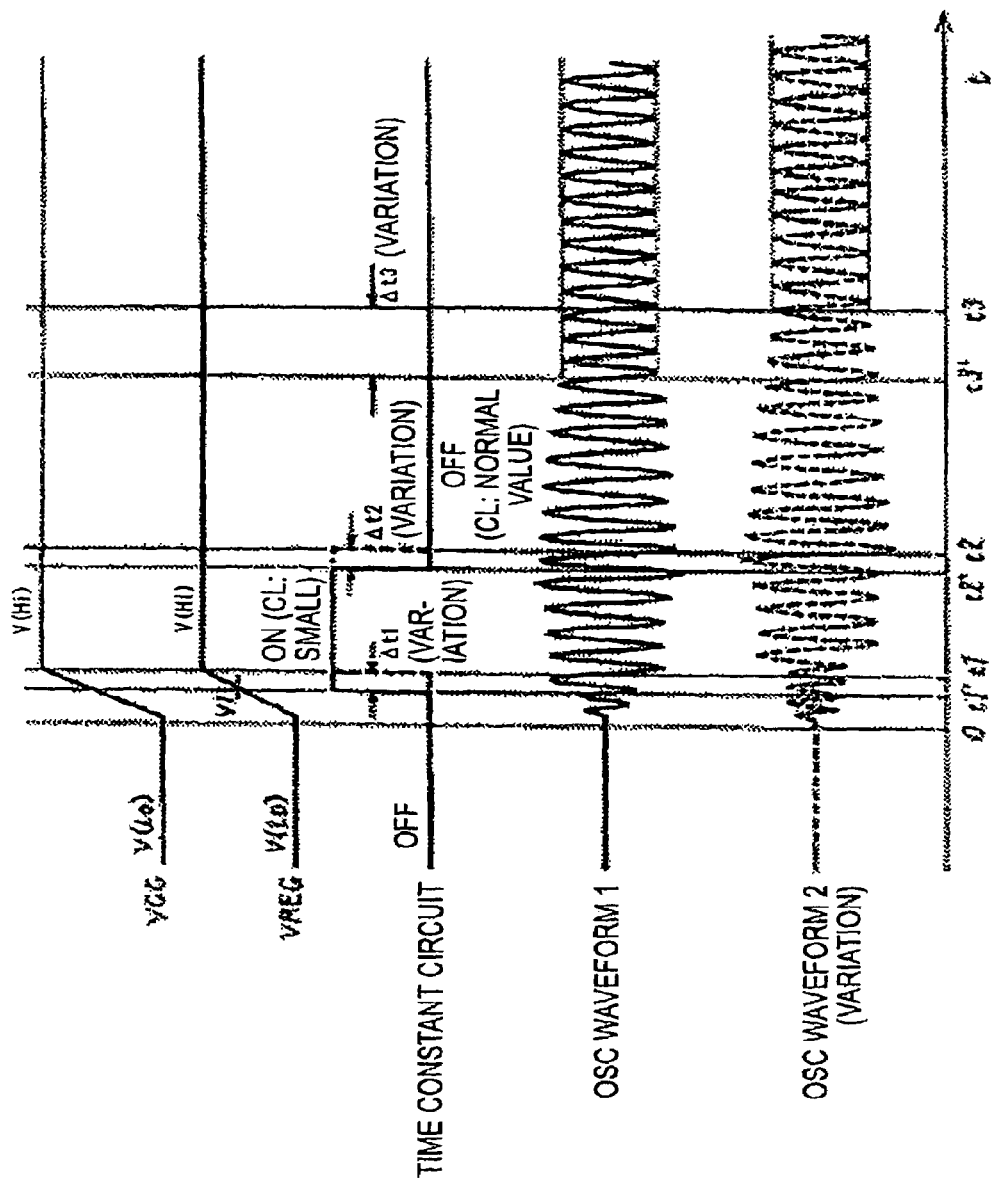
FIG. 6 is a chart (1) showing an example of a variation in the starting characteristic of the oscillating circuit according to the first embodiment of the invention (a drawback obtained in the case in which the REG voltage detecting circuit (4) and the time constant circuit 2 (5) are not operated but only the time constant circuit 1 (6) is operated)

FIG. 6 shows an example of a variation in the starting characteristic of the oscillating circuit according to the embodiment (a drawback obtained in the case in which the REG voltage detecting circuit (4) and the time constant circuit 2 (5) are not operated but only the time constant circuit 1 (6) is operated When the source voltage VCC rises, the REG voltage rises following the source voltage VCC and comes to a certain voltage at a time of t=t1. Referring to the oscillating waveform of the oscillator, the time constant circuit 1 (6) is started to be operated for a duration from the initiation of the rise in the REG voltage to the time of t=t1 and the switches 7 and 8 for reducing the load capacity CL value are turned ON in response to a signal output from the time constant circuit 1 (6) at t1≦t≦t2 so that the load capacity CL of the oscillator is maintained to be small. The oscillator carries out an oscillation at 0≦t≦t1 and the load capacity CL is small at t1≦t≦t2. Therefore, an amplitude is increased considerably quickly. The switches 7 and 8 are turned OFF so that the CL value is changed into a normal value at the time of t=t2, and the amplitude gradually approaches a stationary state and the oscillating waveform is stabilized at a time of t=t3. In that case, an operation start time of t=t1' is expressed in 0≦t1'≦t1, wherein a voltage of VREG which is required for initiating the operation of the time constant circuit 1 (6) is represented by V1 (0<V1<V (Hi)) and a time that the VREG rises is represented by t1. If V1 has a variation of ΔV1 (=V(Hi)−V1), t1' has a variation of Δt1 (=t1−t1') and t2' has a variation of Δt2 (=t2−t2'≈Δt1) as shown in FIG. 6. Similarly, t3' generates a variation of Δt3 (=t3−t3').

Figure 7:
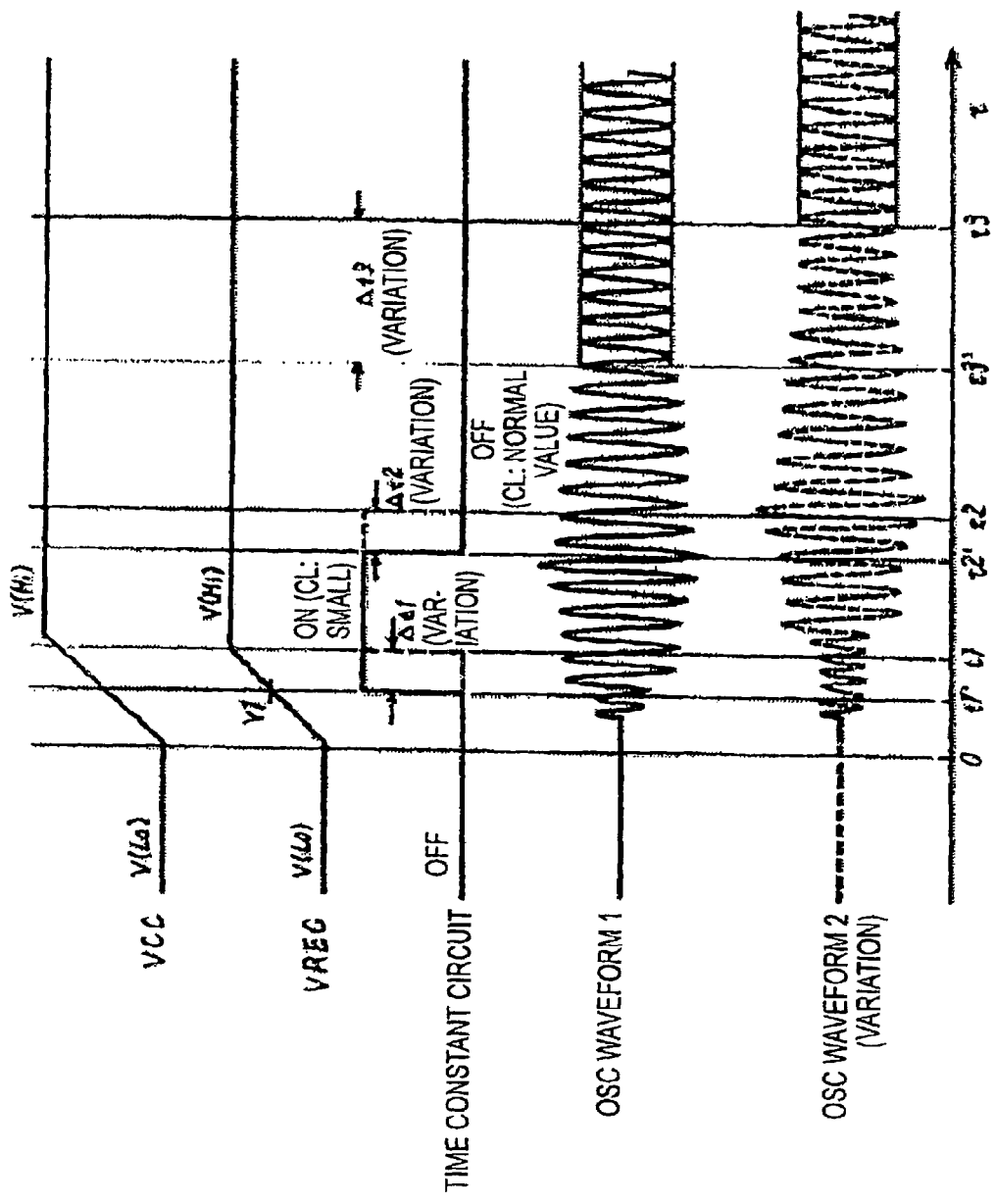
FIG. 7 is a chart (2) showing an example of a variation in the starting characteristic of the oscillating circuit according to the first embodiment of the invention (the drawback obtained in the case in which the REG voltage detecting circuit (4) and the time constant circuit 2 (5) are not operated but only the time constant circuit 1 (6) is operated)

FIG. 7 shows another example of the variation in the starting characteristic of the oscillating circuit according to the embodiment (a drawback obtained in the case in which the REG voltage detecting circuit (4) and the time constant circuit 2 (5) are not operated but only the time constant circuit 1 (6) is operated), illustrating the case in which the source voltage VCC rises more slowly than that in the case of FIG. 6. In the case in which the voltage V1 (0<V1<V(Hi)) of VREG required for initiating an operation in the start of the time constant circuit 1 (6) is constant and ΔV1 is also constant, Δt1 is greater than Δt1 in FIG. 6 because an inclination in the start of the source voltage VCC and the REG voltage is small.

Similarly, Δt2 is also greater than that in the case of FIG. 6. Similarly, Δt3 is also greater than that in the case of FIG. 6 and it can be supposed that a variation is greater.

As described above, there is a drawback that the starting time of the oscillating circuit according to the embodiment is unstable depending on the starting condition of the source voltage VCC and a variation in the operation start voltage V1 of the time constant circuit 1 (6) in the case in which the REG voltage detecting circuit (4) and the time constant circuit 2 (5) are not operated but only the time constant circuit 1 (6) is operated.

In the embodiment, therefore, the REG voltage detecting circuit (4) is operated and the operation start time of the time constant circuit 1 (6) is set to be a time that the voltage of VREG rises completely, and furthermore, the time constant circuit 2 (5) is operated in order to improve the drawback.

The REG voltage detecting circuit (4) can be constituted by a Schmitt circuit for monitoring the REG voltage to be the output of the REG voltage circuit (2) and causing an output to suddenly rise with the threshold V1. Alternatively, the REG voltage detecting circuit (4) can be constituted by a Schmitt circuit for causing the output to suddenly rise when the REG voltage reaches a predetermined voltage V (Hi).

Figure 8:
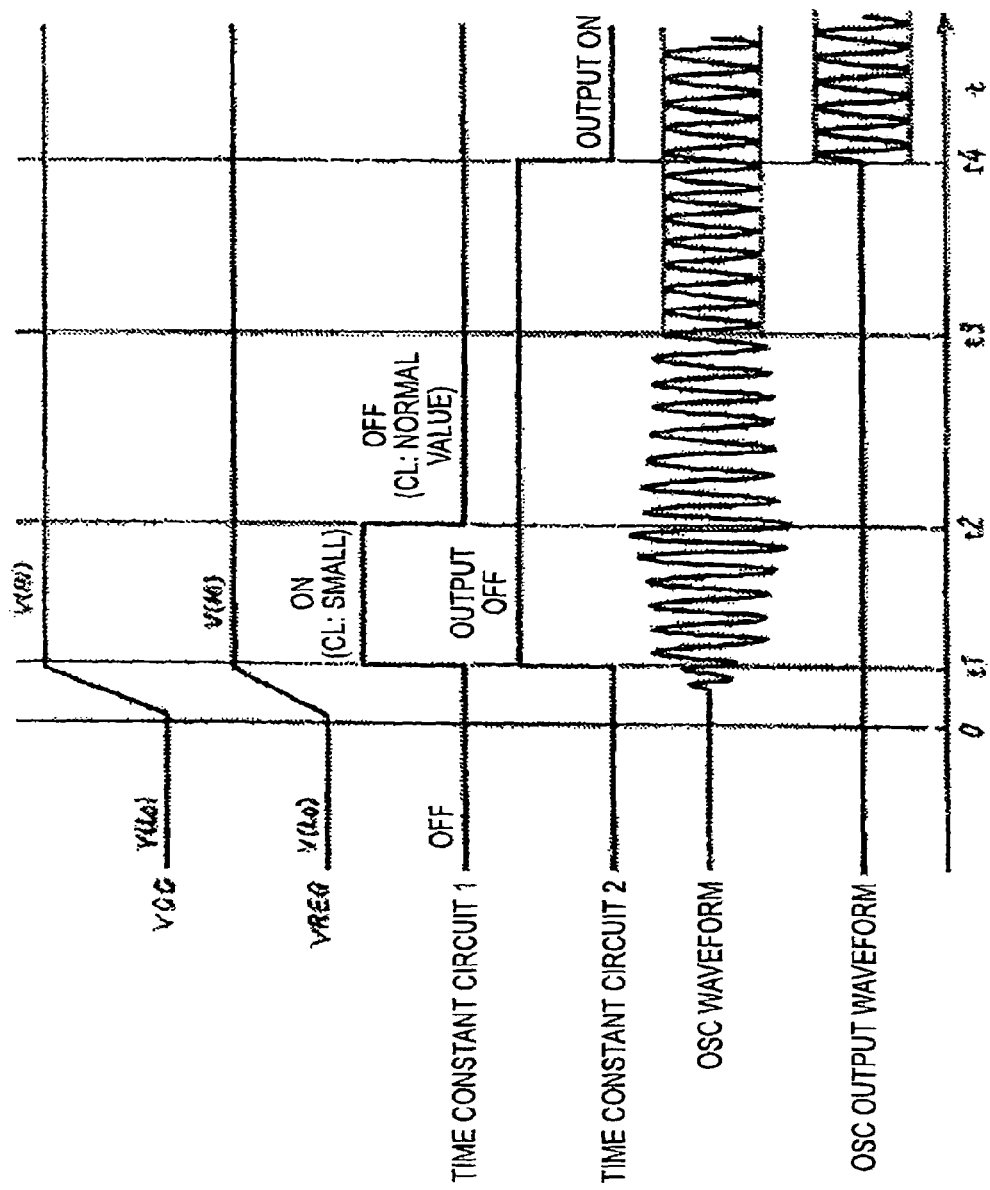
FIG. 8 is a chart showing an example of the starting characteristic in the case in which all of the REG voltage detecting circuit (4), the time constant circuit 1 (6) and the time constant circuit 2 (5) are operated according to the first embodiment of the invention.

FIG. 8 shows an example of the starting characteristic in the case in which all of the REG voltage detecting circuit (4), the time constant circuit 1 (6) and the time constant circuit 2 (5) are operated in the oscillating circuit according to the embodiment. In this case, the operation start time of the time constant circuit 1 (6) is set to be the time of t t1 that the voltage of the VREG completely rises. Therefore, the variation Δt1 at the time of t1 is reduced. Referring to the load capacity CL, consequently, the oscillator can start an oscillation in a state in which the VREG rises and the circuit rises stably, and an OSC waveform can stably start an oscillation, thereby stabilizing a starting time.

In the case in which the time constant circuit 2 (5) is operated as shown in FIG. 1, furthermore, the switch (9) is turned OFF to prevent the output waveform of the oscillator from being output during a time of (t1–t4) for the operation. Consequently, it is possible to prevent a delay of starting or a non-oscillation from being caused by an output waveform generated in the starting which goes around the oscillator.

From the foregoing, it is possible to generate a stable oscillating waveform such as the OSC output waveform in FIG. 8 at a stable starting time of t=t4

Second Embodiment

Figure 9:
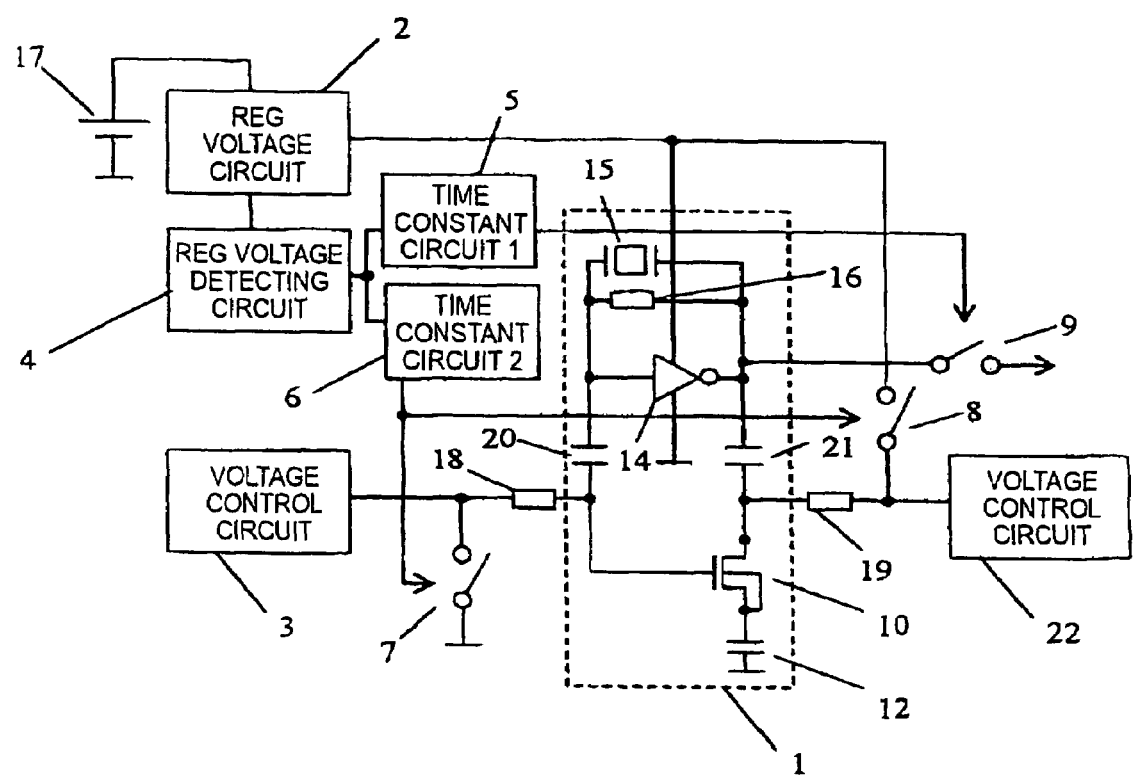
FIG. 9 is a circuit diagram showing an example of a structure of an oscillator starting control circuit according to a second embodiment of the invention.

FIG. 9 is a diagram showing a second embodiment of an oscillator starting control circuit in which the shape of the variable capacitance unit (10) and a method of applying a voltage from the voltage control circuits (3, 22) are different from those of the first embodiment.

In FIG. 9, an REG voltage is applied to an oscillating circuit (1) by an REG voltage circuit (2) to which a source voltage (17) is applied The oscillating circuit (1) in FIG. 9 is a crystal oscillating circuit in which an input and an output in an inverter (14) are connected to both ends of a crystal oscillator (15) and both ends of a resistor (16), and furthermore, the input and the output are connected to capacities (20) and (21) for cutting a control voltage to be applied to the MOS variable capacity (10), and the MOS variable capacity (10) has a gate connected to the first control voltage circuit (3) and a drain connected to the second control voltage circuit (22) and the MOS variable capacity (10) has a source connected to a fixed capacity (12) and the other end of the fixed capacity (12) is connected to a GND.

Furthermore, a resistor (18) and a switch (7: a first switch) are connected to the gate of the MOS variable capacity (10) and a resistor (19) and a switch (8: a first switch) are connected to the drain thereof, and the first control voltage circuit (3) is connected to the other end of the resistor (18) and the second control voltage circuit (22) is connected to the other end of the resistor (19).

By operating the oscillator starting control circuit according to the embodiment in the same manner as that in the first embodiment, it is possible to maintain a load capacity CL of the crystal oscillating circuit (1) to be small for a predetermined time and to initiate an oscillation early in starting.

By opening the switches (7, 8) when the oscillation is started to some degree, moreover, it is possible to control the capacity value of the MOS variable capacity (10) with a control voltage applied from the voltage control circuit (3, 22) and to regulate the load capacity CL, thereby carrying out a stable oscillation at a desirable frequency f0.

Furthermore, a time constant circuit 2 (5) is operated to turn OFF a switch (9: a second switch) for an operating time, thereby preventing the output waveform of the oscillator from being output. Consequently, it is possible to prevent a delay of starting or a non-oscillation from being caused by the output waveform generated in the starting which goes around the oscillator.

Third Embodiment

Figure 10:
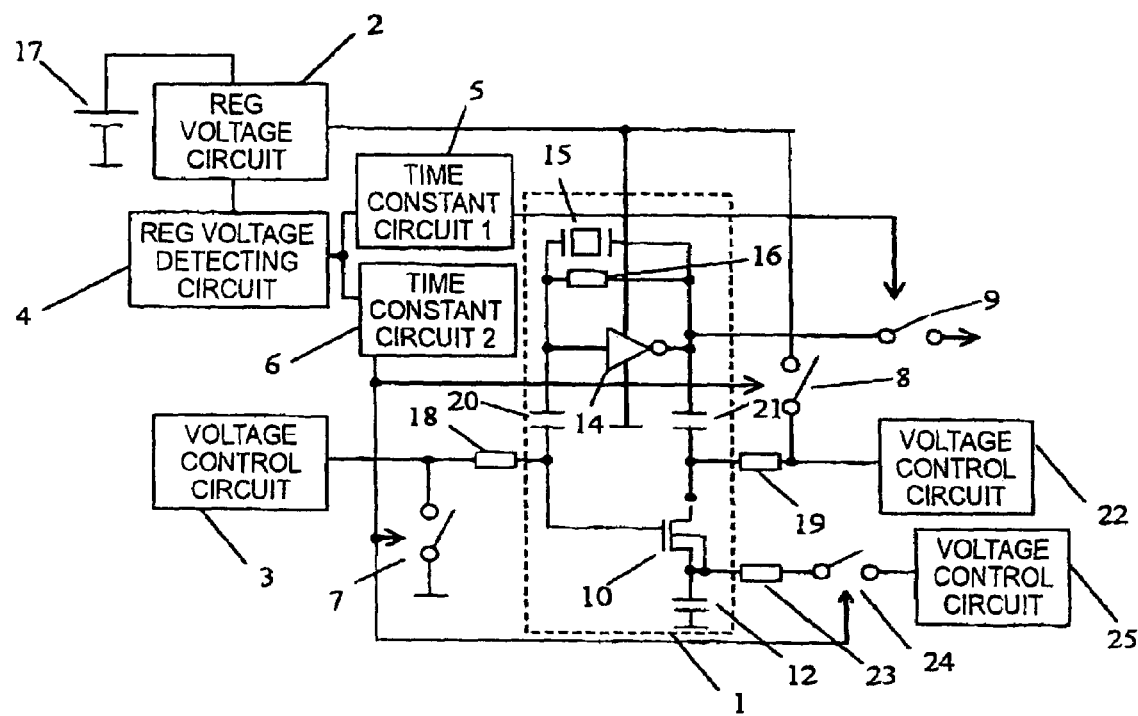
FIG. 10 is a circuit diagram showing an example of a structure of an oscillator starting control circuit according to a third embodiment of the intention.

FIG. 10 is a diagram showing a third embodiment in which a floating node is fixed to an oscillation stabilizing voltage by a switch (24) for fixing the floating node of a variable capacitance unit (10) for a constant time generated by a time constant circuit 1 (6) and the floating node is then returned into a normal floating state after the constant time.

An oscillating circuit (1) shown in FIG. 10 is a crystal oscillating circuit in which a resistor (23) and the switch (24: a third switch) are connected to a source of the MOS variable capacity (10) of the oscillating circuit (1) in FIG. 9 and a third control voltage circuit (25) is connected to the other end of the resistor (23).

On the other hand, an REG voltage detecting circuit (4) is connected in such a manner that a signal for detecting a rise in an REG voltage circuit (2) is transmitted thereto and is connected to transmit the same signal to time constant circuits 1 and 2 (6, 5) Furthermore, the time constant circuit 1 (6) is connected to transmit a control signal for short-circuiting or opening the switch (24) in response to the signal described above.

In FIG. 10, the time constant circuit 1 (6) short-circuits the switch (24) connected to the floating node for a certain duration from a reference time and opens the switch (24) when a certain time passes. Consequently, it is possible to enhance the stability of the floating node of the variable capacitance unit (10) during the starting of an oscillation and to output a constant oscillating frequency after the starting of the oscillating circuit.

Fourth Embodiment

Figure 11:
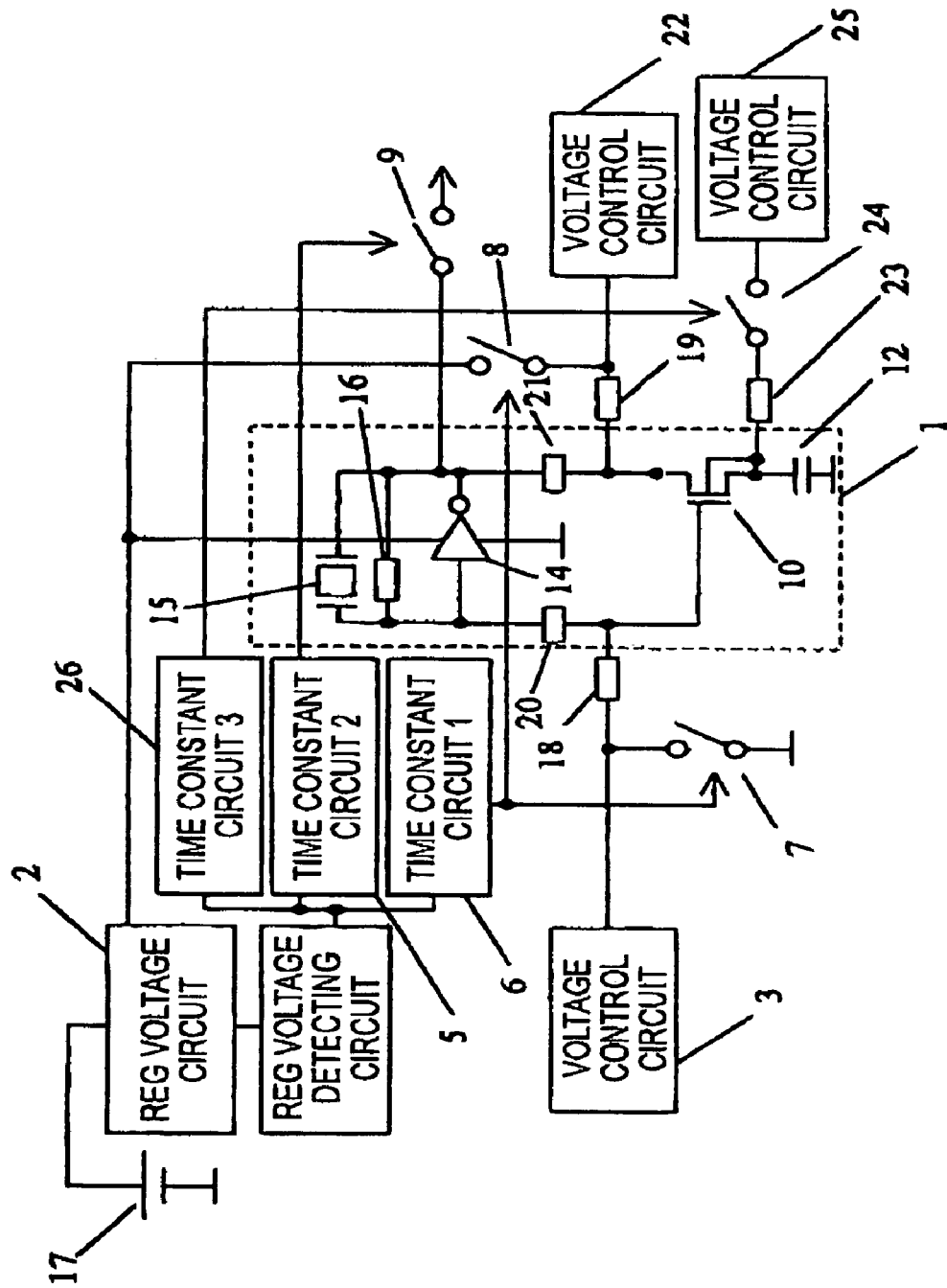
FIG. 11 is a circuit diagram showing an example of a structure of an oscillator starting control circuit according to a fourth embodiment of the invention.

FIG. 11 is a diagram showing a fourth embodiment in which a floating node of a variable capacitance unit (10) is fixed to an oscillation stabilizing voltage by a switch (24) for fixing the floating node for a constant time generated by a time constant circuit 3 (26) and the floating node is returned into a normal floating state after the constant time in order to enhance the stability of an oscillating frequency after starting.

On the other hand, an REG voltage detecting circuit (4) is connected in such a manner that a signal for detecting a rise in an REG voltage circuit (2) is transmitted thereto and is connected to transmit the same signal to time constant circuits 1 and 2 (6, 5) Furthermore, the time constant circuit 3 (26) is connected to transmit a control signal for short-circuiting or opening the switch (24) in response to the signal described above.

In FIG. 11, the time constant circuit 3 (26) short-circuits the switch (24) connected to the floating node for a certain duration from are reference time and opens the switch (24) when a certain time passes. Consequently, it is possible to enhance the stability of the floating node of the variable capacitance unit (10) during the starting of an oscillation and to output a constant oscillating frequency after the starting of the oscillating circuit.

Figure 12:
FIG. 12 is a chart showing an example of a frequency starting characteristic of a conventional oscillating circuit.

FIG. 12 shows an example of the frequency starting characteristic of a conventional oscillating circuit. When a source voltage VCC rises at a time of t=0, an REG voltage rises following the source voltage VCC and the output frequency of the oscillating circuit is started to output a frequency f0 determined by a crystal oscillator (15) and a load capacity CL. In the case in which the floating node is present in the variable capacitance unit (10), however, the voltage of the floating node fluctuates Therefore, a convergence to the frequency f0 is not carried out at a time of t=t02 but is carried out at a time of t=t04, and a stable oscillation cannot be carried out at the frequency f0 before the time of t=t04 after starting.

Figure 13:
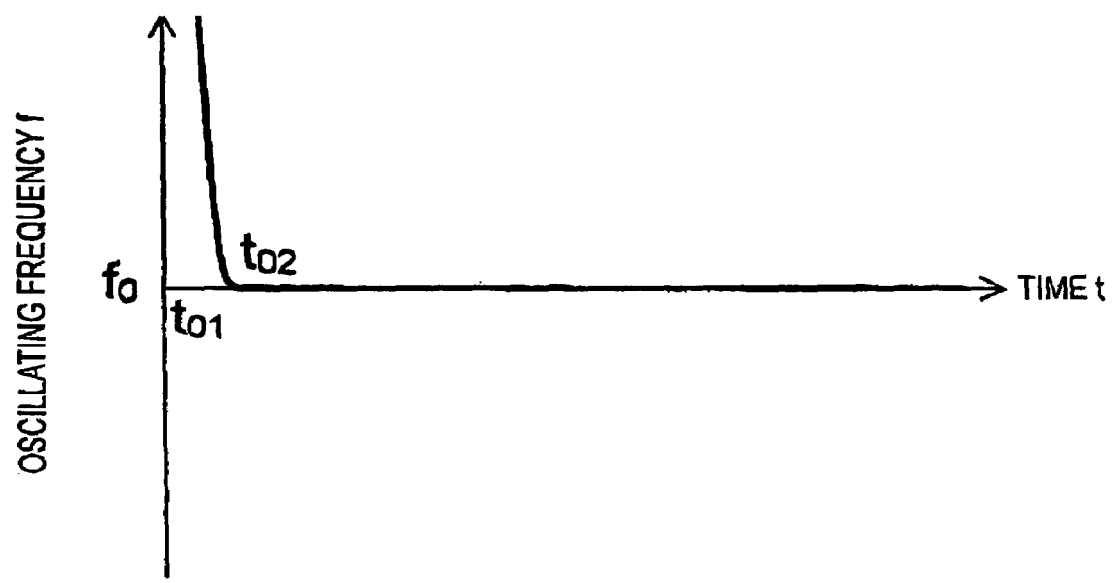
FIG. 13 is a chart (1) showing an example of a frequency starting characteristic in the case in which a floating node fixing circuit is provided according to the third embodiment of the invention.

FIG. 13 shows an example of the frequency starting characteristic in the case in which a floating node fixing circuit (the switch (24), a voltage control circuit (25)) is provided according to the embodiment. When the source voltage VCC rises, the REG voltage rises following the source voltage VCC. By changing over the switch (24) at a certain time of t=t01 in a time of t=t02 after the initiation of the rise in the REG voltage, it is possible to carry out a stable oscillation at the frequency f0 at the time of t=t02.

Figure 14:
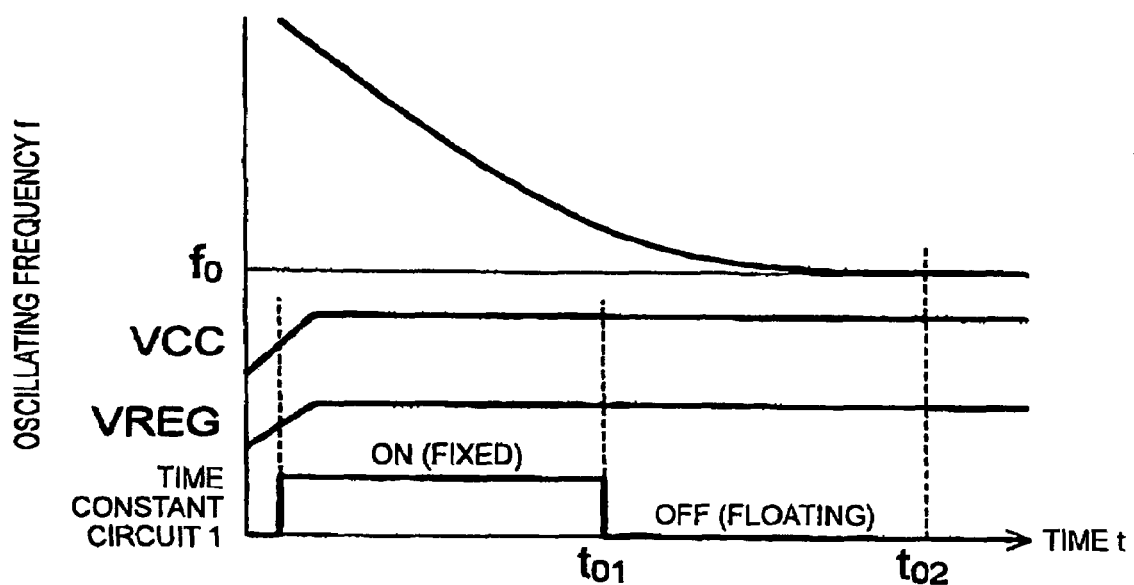
FIG. 14 is a chart (2) showing an example of the frequency starting characteristic in the case in which the floating node fixing circuit is provided according to the third embodiment of the invention.

FIG. 14 shows an example of the frequency starting characteristic in the case in which the floating node fixing circuit is provided according to the embodiment. When the source voltage VCC rises, the REG voltage rises following the source voltage VCC. By short-circuiting the switch (24) at a certain time of t=t01 in a time of t=t02 after the initiation of the rise in the REG voltage, the floating node is fixed to have an oscillation stabilizing voltage. By opening the switch (24) at the time of t=t01, the floating node is set to have a stable voltage earlier At the time of t=t02, a stable oscillation can be carried out at a frequency f0.

Figure 15:
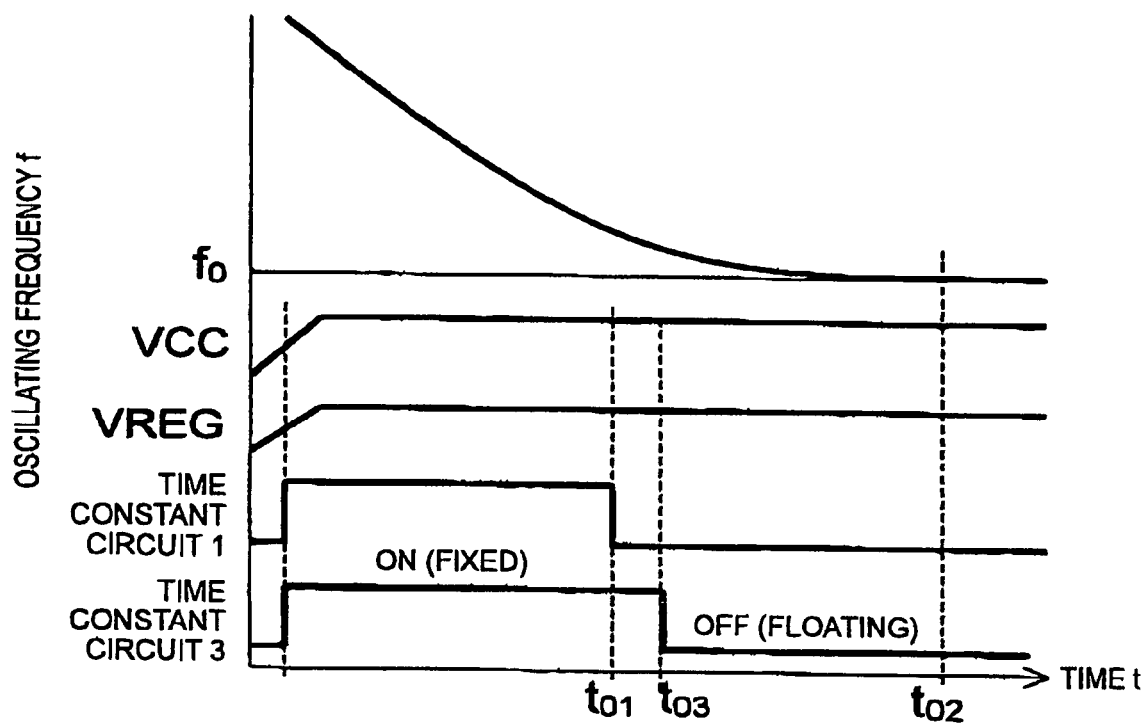
FIG. 15 is a chart showing an example of a frequency starting characteristic in the case in which a floating node fixing circuit is provided according to the fourth embodiment of the intention.

FIG. 15 shows an example of the frequency starting characteristic in the case in which the floating node fixing circuit is provided and the time constant circuit 3 is used according to the embodiment. When the source voltage VCC rises, the REG voltage rises following the source voltage VCC. By short-circuiting the switch (24) at a certain time of t=t03 in a time of t=t02 after the initiation of the rise in the REG voltage, the floating node is fixed to have an oscillation stabilizing voltage. By opening the switch (24) at the time of t=t03, the floating node is set to have a stable voltage earlier. At the time of t=t02, a stable oscillation can be carried out at a frequency f0.

As described above, according to the oscillator starting control circuit in accordance with the embodiment, it is possible to remarkably shorten a starting time and to stabilize the starting time Moreover, it is possible to stabilize an oscillating frequency after starting the oscillating circuit.

By using the oscillator starting control circuit according to the embodiment in portable equipment represented by a cell phone, furthermore, it is possible to prolong a time required for an OFF state by shortening a starting time in an intermittent operation Therefore, it is possible to enhance the effect of reducing a consumed power.

An oscillator starting control circuit according to the invention has such an advantage that a starting time can be shortened remarkably and can be stabilized, and is useful for an oscillator starting control circuit which is suitable for shortening and controlling the starting time of a crystal oscillator circuit and stabilizing an oscillating frequency

What is claimed is:

1. An oscillator starting control circuit, comprising:
   a voltage control circuit for changing a capacity value of a MOS variable capacity to carry out a regulation into a predetermined oscillating frequency in an oscillating loop formed by a crystal oscillator and the MOS variable capacity, comprising:
   a first switch, reducing the capacity value of the MOS variable capacity for a predetermined period after a source voltage rises,
   a first time constant circuit, setting an operating period of the first switch in response to a rise in the source voltage which is supplied, and
   a second switch for carrying out a short circuit for a predetermined period after the source voltage rises, thereby fixing a back-gate of the MOS variable capacity to have a predetermined voltage.

2. The oscillator starting control circuit according to claim 1, wherein the first switch is connected to a gate of the MOS variable capacity and a reference potential.

3. The oscillator starting control circuit according to claim 1, further comprising:

a third switch, cutting off an oscillator output for a predetermined period after the source voltage rises.

4. The oscillator starting control circuit according to claim 3, further comprising:
a second time constant circuit, setting a cut-off period of the third switch in response to rising of the source voltage.

5. The oscillator starting control circuit according to claim 1, further comprising:
a first capacity, connecting a gate of the MOS variable capacity to one of ends of the crystal oscillator; and
a second capacity for connecting a drain of the MOS variable capacity to the other end of the crystal oscillator,
a control voltage being applied to the gate and the drain of the MOS variable capacity to change the capacity value of the MOS variable capacity, thereby carrying out the regulation into a predetermined osculating frequency.

6. The oscillator starting control circuit according to claim 1 or 4, further comprising a voltage detecting circuit for detecting rising of the source voltage and supplying a driving signal to the first or second time constant circuit.

7. The oscillator starting control circuit according to claim 1, wherein a short-circuit period of the second switch is set by the first time constant circuit.

8. The oscillator starting control circuit according to claim 1, wherein a short-circuit period of the second switch is set by a second time constant circuit.

* * * * *